(12) United States Patent
Akram et al.

(10) Patent No.: US 6,204,678 B1
(45) Date of Patent: Mar. 20, 2001

(54) DIRECT CONNECT INTERCONNECT FOR TESTING SEMICONDUCTOR DICE AND WAFERS

(75) Inventors: Salman Akram; James M. Wark, both of Boise; Warren M. Farnworth, Nampa, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/302,833

(22) Filed: Apr. 30, 1999

Related U.S. Application Data

(62) Division of application No. 08/818,456, filed on Mar. 17, 1997, now Pat. No. 6,025,730.

(51) Int. Cl.⁷ ........................................... G01R 1/73
(52) U.S. Cl. ........................................... 324/758; 324/757
(58) Field of Search ................... 439/289, 69; 324/755, 324/758, 765, 757, 158.1

(56) References Cited

U.S. PATENT DOCUMENTS

| | | |
|---|---|---|
| 4,891,585 | 1/1990 | Janko et al. . |
| 4,906,920 | 3/1990 | Huff et al. . |
| 4,918,383 | 4/1990 | Huff et al. . |
| 5,006,792 | 4/1991 | Malhi et al. . |
| 5,068,602 * | 11/1991 | Mielke ................................. 324/755 |
| 5,073,117 | 12/1991 | Malhi et al. . |
| 5,123,850 | 6/1992 | Elder et al. . |
| 5,124,639 | 6/1992 | Carlin et al. . |
| 5,172,050 | 12/1992 | Swapp . |
| 5,180,977 | 1/1993 | Huff . |
| 5,264,787 | 11/1993 | Woith et al. . |
| 5,302,891 | 4/1994 | Wood et al. . |
| 5,322,446 | 6/1994 | Cearley-Cabbiness . |
| 5,367,253 | 11/1994 | Wood et al. . |
| 5,408,190 | 4/1995 | Wood et al. . |
| 5,418,471 * | 5/1995 | Kardos ................................. 324/758 |
| 5,420,520 | 5/1995 | Anschel et al. . |
| 5,424,652 | 6/1995 | Hembree et al. . |
| 5,440,240 | 8/1995 | Wood et al. . |
| 5,451,165 | 9/1995 | Cearley-Cabbiness . |
| 5,481,436 * | 1/1996 | Werther ................................. 439/69 |
| 5,483,174 | 1/1996 | Hembree et al. . |
| 5,483,741 | 1/1996 | Akram et al. . |
| 5,517,125 | 5/1996 | Posedel et al. . |
| 5,530,376 | 6/1996 | Lim et al. . |
| 5,541,525 | 7/1996 | Wood et al. . |

(List continued on next page.)

OTHER PUBLICATIONS

Cobra™ technology makes Wentworth Labs the world's most advanced probe card manufacturer, Wentworth Laboratories, advertising brochure, 1/1996.
Science Over Art. Our New IC Membrane Test Probe., Packard Hughes Interconnect, advertising brochure, 1/993.

*Primary Examiner*—Safet Metjahic
*Assistant Examiner*—Jose M. Solis
(74) *Attorney, Agent, or Firm*—Stephen A. Gratton

(57) ABSTRACT

An interconnect and system for testing semiconductor dice, and a test method using the interconnect are provided. The interconnect includes a substrate having patterns of contact members for electrically contacting the dice. The interconnect also includes patterns of conductors for providing electrical paths to the contact members. In addition, the interconnect includes contact receiving cavities configured to retain electrical connectors of a testing apparatus in electrical communication with the conductors. A die level test system includes the interconnect mounted to a temporary package for a singulated die. In the die level test system, the interconnect provides direct electrical access from testing circuitry to the die. A wafer level test system includes the interconnect mounted to a probe card fixture of a wafer probe handler. In the wafer level test system, the contact receiving cavities can be configured to support and align the interconnect to the probe card fixture.

36 Claims, 4 Drawing Sheets

U.S. PATENT DOCUMENTS

| | | |
|---|---|---|
| 5,543,725 | 8/1996 | Lim et al. . |
| 5,559,446 * | 9/1996 | Sano ..................................... 324/758 |
| 5,592,736 | 1/1997 | Akram et al. . |
| 5,600,259 * | 2/1997 | Baryzel ............................... 324/758 |
| 5,635,847 * | 6/1997 | Seidel .................................. 324/755 |
| 5,686,317 | 11/1997 | Akram et al. . |
| 5,691,649 | 11/1997 | Farnworth et al. . |
| 5,731,709 | 3/1998 | Pastore et al. . |
| 5,783,461 | 7/1998 | Hembree . |
| 5,815,000 | 9/1998 | Farnworth et al. . |
| 5,834,945 | 11/1998 | Akram et al. . |
| 5,844,418 | 12/1998 | Wood et al. . |
| 5,869,974 | 2/1999 | Akram et al. . |
| 5,878,485 | 3/1999 | Wood et al. . |
| 5,894,161 | 4/1999 | Akram et al. . |
| 5,896,036 | 4/1999 | Wood et al. . |
| 5,915,977 | 6/1999 | Hembree et al. . |
| 5,926,027 * | 7/1999 | Bumb .................................. 324/755 |
| 5,929,647 | 7/1999 | Akram et al. . |
| 5,982,185 | 11/1999 | Farnworth . |
| 6,025,730 | 2/2000 | Akram et al. . |
| 6,060,891 | 5/2000 | Hembree et al. . |
| 6,072,321 | 6/2000 | Akram et al. . |

\* cited by examiner

DIRECT CONNECT INTERCONNECT FOR TESTING SEMICONDUCTOR DICE AND WAFERS

CROSS REFERENCE TO RELATED APPLICATIONS

This application is a division of patent application Ser No. 08/818,456 filed Mar. 17, 1997, U.S. Pat. No. 6,025,730.

FIELD OF THE INVENTION

This invention relates generally to semiconductor manufacture and more particularly to an improved interconnect for testing semiconductor dice and wafers. The invention also relates to a test method and system that employ the interconnect.

BACKGROUND OF THE INVENTION

For testing semiconductor dice, temporary electrical connections must be made to the integrated circuits on the dice. Typically, the electrical connections are made through contact locations, such as bond pads or test pads, formed on the faces of the dice. Testing at the wafer level can be performed using probe cards and a wafer probe handler. Probe cards include probe needles that electrically contact the contact locations on the wafer. Test circuitry associated with the wafer probe handler applies test signals through the probe card to the integrated circuits.

Testing can also be performed on dice that have been singulated from the wafer. In this case, temporary packages are adapted to house a single bare die on a burn-in board or other test apparatus. The temporary packages typically include an interconnect having contact members configured to electrically contact the contact locations on the die.

With wafer level testing, electrical connections must be made to the probe card. With die level testing, electrical connections must be made to the interconnect for the temporary package. These electrical connections are typically bonded connections. With bonded connections it can be difficult to separate a probe card from the wafer handler, or an interconnect from a temporary package, without damage. This makes replacing and interchanging the probe cards and interconnects difficult.

Another requirement of the connections to a probe card or interconnect is that the electrical connections must sometimes be capable of transmitting signals at high test speeds (e.g., 500 MHz). It is desirable to transmit test signals without generating parasitic inductance and cross coupling (i.e., "cross talk").

Often times the electrical connections with the probe card or interconnect are sources of parasitic inductance. For example, with temporary packages having wire bonded interconnects, it can be difficult to accurately space the bond wires from one another. Accordingly, capacitive coupling can occur between adjacent bond wires generating noise and spurious signals.

The problems of parasitic inductance and cross coupling can be compounded by the large number of bond pads contained on later generations of semiconductor dice. In particular, a large number of bond pads requires a corresponding number of electrical connections to the probe card or interconnect. It can be difficult to make these electrical connections without forming parasitic inductors and initiating cross talk and interconductor noise.

The present invention is directed to an improved interconnect capable of high speed testing of either wafers or singulated dice, with reduced parasitics inductance. In addition, non-bonded electrical connections can be made to the interconnect, such that removing and replacing the interconnect is facilitated.

SUMMARY OF THE INVENTION

In accordance with the present invention, an improved interconnect and system for testing semiconductor dice, and a test method using the interconnect are provided. The interconnect includes a substrate having contact members configured to make temporary electrical connections with contact locations on the dice. The contact members can be configured to electrically contact bumped contact locations on the dice, such as solder bumps, or flat contact locations on the dice, such as metal bond pads.

The interconnect also includes patterns of conductors in electrical communication with the contact members. In addition, contact receiving cavities are formed on the substrate to facilitate an electrical connection from a testing apparatus to the conductors. Each separate conductor is configured to connect to a mating electrical connector of the testing apparatus, such as a spring clip, socket contact, spring loaded pin, or other member. The contact receiving cavities permit non-bonded, direct electrical connections to be made from testing circuitry to the interconnect.

The interconnect substrate can be formed of silicon, or an electrically insulating material, such as ceramic. For dice with bumped contact locations, the contact members can comprise depressions formed in the substrate and covered with a conductive layer. The depressions can be formed at the same time as the contact receiving cavities using a bulk micro-machining process. Alternately, for dice with flat contact locations, the contact members can include penetrating projections covered with a conductive layer.

The interconnect can be configured for use with a die level test system or a wafer level test system. With a die level test system, the interconnect can be mounted within a temporary package for a single die. The temporary package is adapted for use with a testing apparatus, such as a burn-in board, in electrical communication with testing circuitry. The temporary package can include a base and a force applying mechanism for biasing the die and interconnect together. In the die level test system, the interconnect establishes temporary electrical communication with the contact locations on the die, and provides conductive paths to and from the testing circuitry to the contact locations.

With a wafer level test system, the interconnect can be configured to contact semiconductor dice contained on a wafer. A conventional testing apparatus, such as a wafer probe handler, can be used to support the interconnect and the wafer. For mounting the interconnect to the testing apparatus, a conventional probe card fixture can be modified for use with the interconnect. The probe card fixture can include an opening for receiving the interconnect. In addition, electrical connectors can be formed on the probe card fixture, along a periphery of the opening, for physically supporting, aligning and electrically connecting the interconnect. In this embodiment, the electrical connectors on the probe card fixture engage the contact receiving cavities on the interconnect. In addition, a biasing member can be used to cushion forces applied by the testing apparatus to the interconnect, and to allow the contact members to self planarize to the contact locations on the wafer. The biasing member can be formed of a compressible elastomer or as a metal filled elastomer configured to dissipate heat.

DETAILED DESCRIPTION OF THE PREFERRED EMBODIMENT

Figure 1:
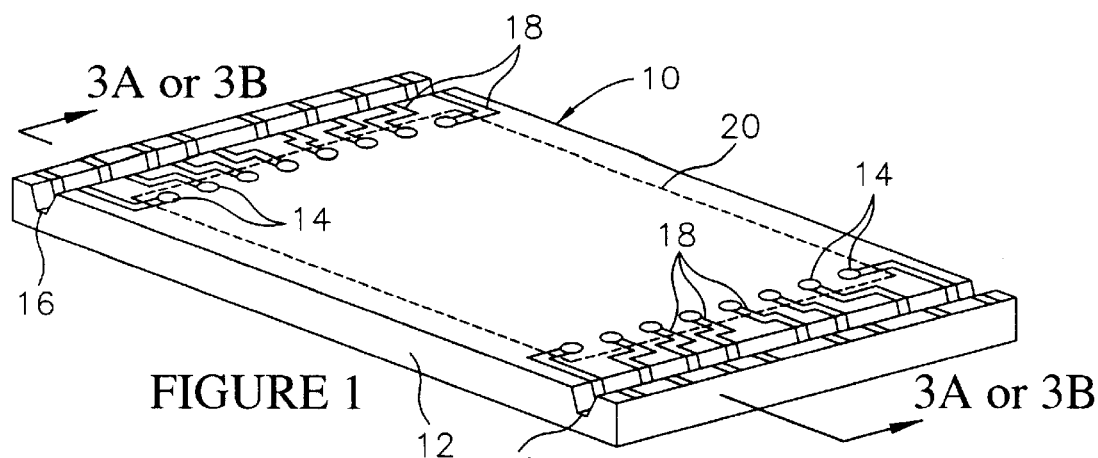
FIG. 1 is a schematic perspective view of a direct connect interconnect constructed in accordance with the invention, with an outline of a semiconductor die superimposed thereon.

Referring to FIG. 1, an interconnect 10 constructed in accordance with the invention is shown. The interconnect 10 is configured to establish temporary electrical communication with a semiconductor die 20 for testing. The interconnect 10 generally stated, comprises: a substrate 12; patterns of contact members 14 formed on the substrate 12; a pair of contact receiving cavities 16 formed along opposite edges of the substrate 12; and patterns of conductors 18 formed on the substrate 12 in electrical communication with the contact members 14.

The substrate 12 can be formed of an etchable material such as silicon, germanium, or photo-machinable glass. The substrate 12 can also be formed of ceramic or other insulating material. In general, these materials are rigid and provide a good CTE match with a silicon die.

Figure 2A:
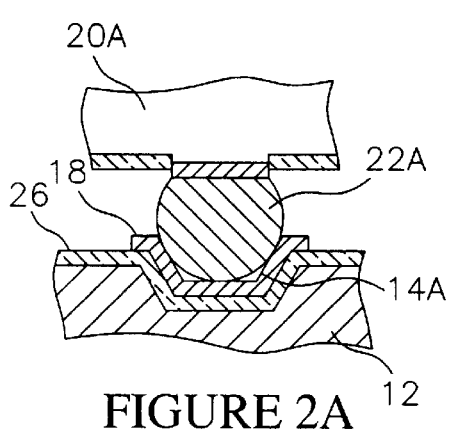
FIG. 2A is a cross sectional view taken along section line 2A—2A of FIG. 3A illustrating a contact member of the interconnect for a die having bumped contact locations.
Figure 2B:
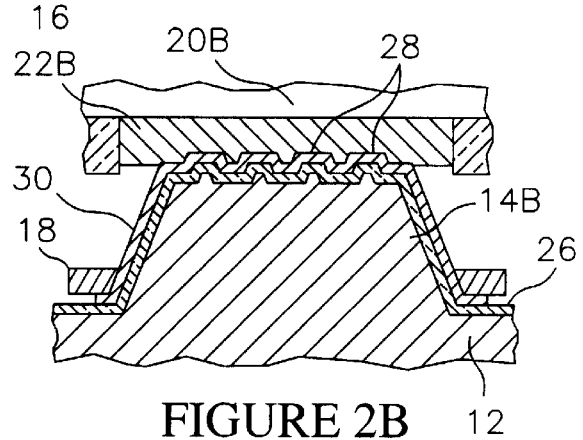
FIG. 2B is a cross sectional view taken along section line 2B—2B of FIG. 3B illustrating an alternate contact member for a die having flat contact locations.

The contact members 14 can be formed integrally with the substrate 12 in patterns that match corresponding patterns of contact locations on the die 20. There are two illustrative embodiments of the contact members 14. In FIG. 2A, contact members 14A are configured to electrically connect to a die 20A having bumped contact locations 22A. In FIG. 2B, contact members 14B are configured to electrically connect to a die 20B having flat contact locations 22B.

Figure 3A:
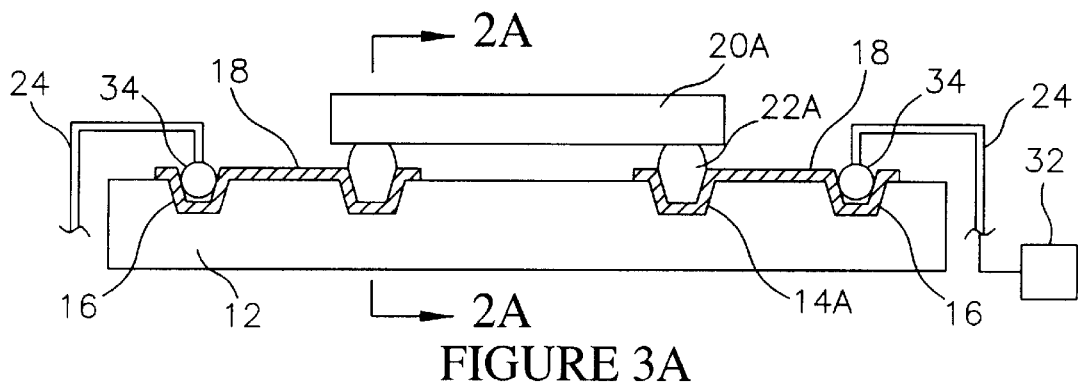
FIG. 3A is a schematic cross sectional view of the interconnect taken along section line 3A—3A of FIG. 1, illustrating the interconnect in electrical communication with the die having bumped contact locations.

Referring again to FIG. 1, the contact receiving cavities 16 can comprise elongated open-ended grooves formed along opposite peripheral edges of the substrate 12. The contact receiving cavities 16 are configured to receive mating electrical connectors 24 (FIG. 3A). In FIG. 1, the contact receiving cavities 16 are formed along opposite lateral edges of the substrate 12. However, the contact receiving cavities 16 can also be formed along the longitudinal edges of the substrate 12, or on other portions of the substrate 12.

One method for forming the contact receiving cavities 16 is by etching the substrate 12. In FIG. 1, the contact receiving cavities 16 are generally v-shaped with a flat bottom, as would occur with an anisotropic etch forming process. However, the contact receiving cavities 16 can also be formed with a rounded contour, as would occur with an isotropic etch forming process. The contact receiving cavities 16 can be formed as elongated, open-ended grooves that are generally parallel to an edge of the substrate 12. Alternately the contact receiving cavities 16 can be formed as an open ended groove generally perpendicular to an edge of the substrate 12.

Still referring to FIG. 1, the conductors 18 electrically connect to the contact members 14 to provide electrical paths to and from the contact members 14. The conductors 18 are formed on a face of the substrate 12, and extend in desired patterns from the contact members 14 into the contact receiving cavities 16. The conductors 18 follow a contour of the contact receiving cavities 16 and are configured to electrically contact the electrical connectors 24 (FIG. 3A) held within the contact receiving cavities 16.

Referring to FIG. 2A, the contact members 14A are sized and shaped to retain the bumped contact locations 22A and to form temporary electrical connections therewith. The contact members 14A can be formed by etching, laser drilling, or machining depressions in the substrate 12. Preferably, the depressions have a size and surface contour that corresponds to the size and surface contour of the bumped contact locations 22A. Conventionally formed solder bumps on the bumped die 20A have a concave contour and an outside diameter of from 5 mils to 30 mils. Accordingly, the depressions can be formed with a corresponding contour and inside diameter.

Each contact member 14A has an associated conductor 18 which follows the contour of the depression for the contact member 14A. The conductors 18 can be formed on the substrate 12 in a required pattern using a suitable metallization process (e.g., CVD, photopatterning, etching). Exemplary metals for forming the conductors 18 include aluminum, copper, silver, palladium, and alloys of these metals. A representative thickness for the conductors 18 can be from 500 Å to 2 $\mu$m.

The conductors 18 can be formed of a same metal throughout, or can be formed of different metals in different portions thereof. For example, portions of the conductors 18 adjacent to the contact receiving cavities 16 can be formed of a wear resistant metal such as gold, palladium, nickel and beryllium copper. As another example, portions of the conductors 18 can formed of a metal such as gold or platinum, that is non-reactive with the bumped contact locations 22A. Furthermore, the conductors 18, or portions thereof, can be formed as a bi-metal stack. The bi-metal stack can include an underlying layer such as nickel adapted to adhere to the substrate 12 and a non-reactive outer layer such as gold. Still further, the conductors 18 can include an insulating outer layer (not shown) formed of a material such as a polymeric or dielectric material.

Still referring to FIG. 2A, with the substrate 12 formed of a semiconducting material such as silicon, an insulating layer 26 can be formed on the substrate 12 to electrically isolate the conductors 18, and contact members 14A, from the bulk of the substrate 12. For example, with the substrate 12 formed of silicon, the insulating layer 26 can be a grown or deposited layer of $SiO_2$. With the substrate 12 formed of an insulating material such as ceramic, an insulating layer will typically not be required.

Referring to FIG. 2B, an alternate embodiment contact member 14B is illustrated. The contact member 14B is equivalent in function to contact member 14A, but is configured to establish electrical communication with a die 20B having a flat contact location 22B. The flat contact location 22B will typically be a metal bond pad, test pad or fuse pad. These types of pads typically comprise thin film aluminum having a thickness of 1.5 μm or less.

Each contact member 14B can include one or more penetrating projections 28 configured to penetrate the contact locations 22B on the die 20B to a limited penetration depth. Each contact member 14B can also include a conductive layer 30 formed of a metal or metal silicide. The contact member 14B and substrate 12 can also include the insulating layer 26 as previously described. A pattern of contact members 14B can be formed integrally with the substrate 12 by etching the substrate 12. Such a process will be more fully described and is also described in U.S. Pat. No. 5,483,741, incorporated herein by reference.

Referring to FIG. 3A, the electrical path from testing circuitry 32 to the bumped die 20A is shown. The testing circuitry 32 is adapted to apply electronic test signals to the integrated circuits formed on the die 20A. As will be further explained, the testing circuitry 32 can be part of a testing apparatus such as a burn-in apparatus or wafer probe handler. The testing apparatus can also include the electrical connectors 24. In a die level system employing the interconnect 10, the electrical connectors 24 can be formed on a socket, or burn-in board, of the testing apparatus. In a wafer level system employing the interconnect 10, the electrical connectors 24 can be spring loaded pins, such as "POGO PINS" sold by Pogo, Industries.

In addition, the electrical connectors 24 can be formed with a tip portion 34, configured to electrically engage corresponding portions of the conductors 18 within the contact receiving cavities 16. The tip portion 34 can be formed with a size and shape for electrically engaging the contact receiving cavities 16. For example the tip portion 34 can be a radiused end of a spring loaded pin or a spherical end of a socket contact. In addition, the electrical connectors 24 can be formed as a spring members, or for engagement by a biasing mechanism. The electrical connectors 24 thus exert a contact force on corresponding portions of the conductors 18 within the contact receiving cavities 16.

In FIG. 3A, the electrical path from the testing circuitry 32 is through the electrical connectors 24 of the testing apparatus, through the conductors 18 on the substrate 12, through the contact members 14A on the substrate 12, through the bumped contact locations 22A on the bumped die 20A, and to the integrated circuits on the die 20A.

Figure 3B:
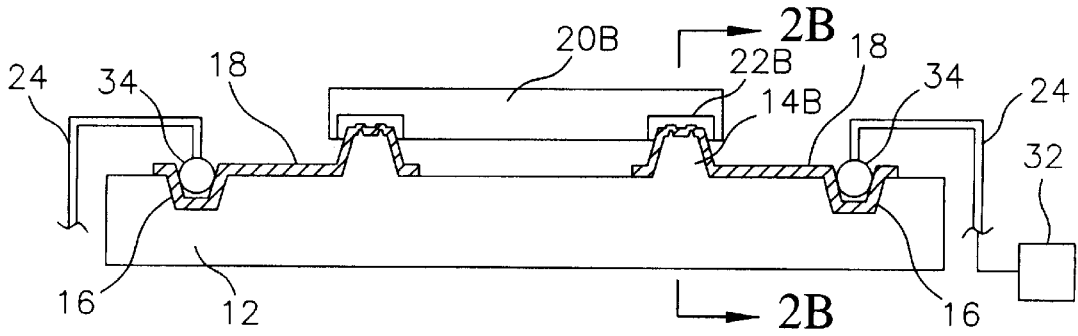
FIG. 3B is a schematic cross sectional view equivalent to FIG. 3A, but illustrating the interconnect in electrical communication with the die having flat contact locations.

FIG. 3B is substantially equivalent to FIG. 3A but shows a conductive path to contact members 14B for flat contact locations 22B. In FIG. 3B, the electrical path from the testing circuitry 32 is through the electrical connectors of the testing apparatus, through the conductors 18 on the substrate 12, through the contact members 14B on the substrate, through the flat contact locations 22B on the die 20B and to the integrated circuits on the die 20B.

Die Level Test System

Figure 4:
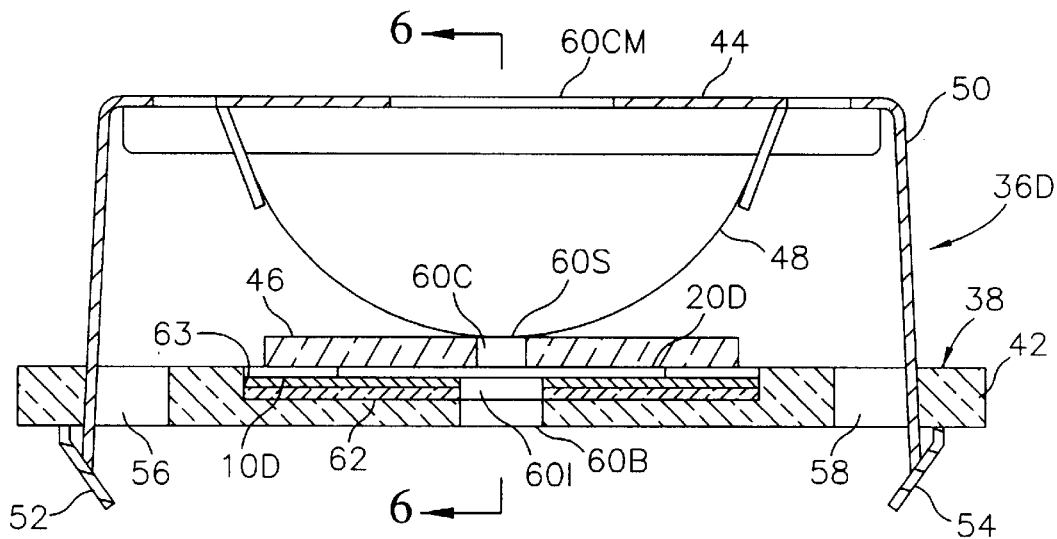
FIG. 4 is a schematic cross sectional view of a die level test system constructed in accordance with the invention.
Figure 5:
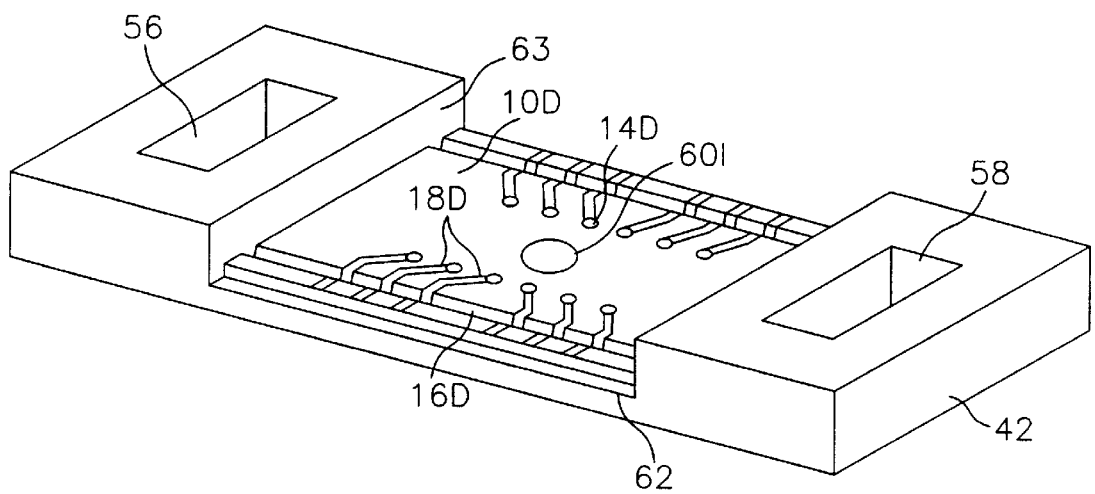
FIG. 5 is a schematic perspective view, with parts removed, of the die level test system.
Figure 6:
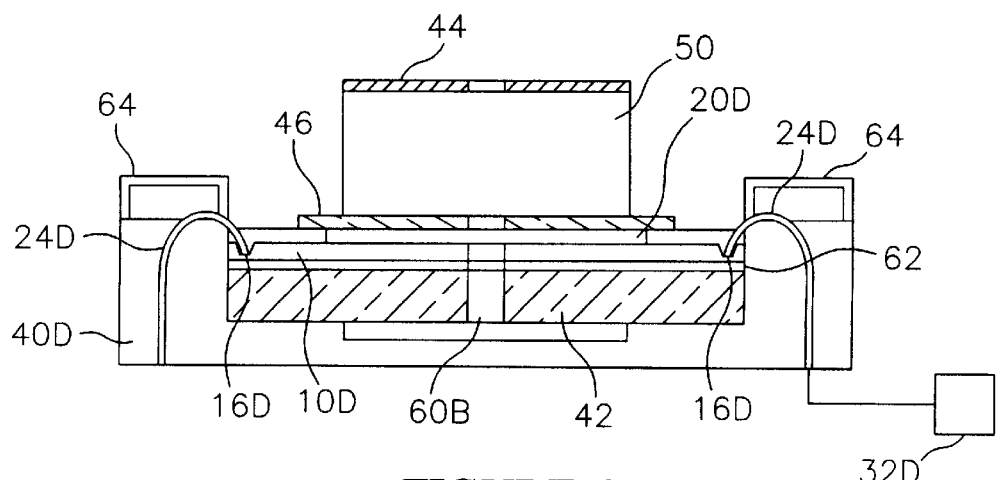
FIG. 6 is a cross sectional view taken along section line 6—6 of FIG. 4.

Referring to FIGS. 4–6, a die level test system 36D is shown. The die level test system 36D is configured to test a singulated semiconductor die 20D. The die 20D can be similar to die 20A (FIG. 3A) with bumped contact locations 22A, or similar to die 20B (FIG. 3B) with flat contact locations 22B.

The system 36D includes a temporary package 38, an interconnect 10D, and a testing apparatus 40D (FIG. 6). The temporary package 38 is configured to house the die 20D in electrical communication with the interconnect 10D. The interconnect 10D is configured to provide a direct electrical connection from the testing apparatus 40D to the die 20D.

The temporary package 38 includes a base 42 and a force applying mechanism 44. The force applying mechanism 44 secures the die 20D to the base 42 and biases the die 20D against the interconnect 10D. The force applying mechanism 44 includes a pressure plate 46, a spring 48 and a clamp member 50. The clamp member 50 includes clips 52, 54 that attach to openings 56, 58 in the base 42. The clamp member 50, spring 48, cover 46, interconnect 10D and base 42 include aligned assembly openings, designated 60CM, 60S, 60C, 60I, 60B, used during assembly of the temporary package 38. The interconnect 10D can be secured to a recess 63 within the base 42 using an adhesive layer 62. Further details of the temporary package 38 are disclosed in U.S. Pat. No. 5,519,332, incorporated herein by reference.

The testing apparatus 40D (FIG. 6) can be a test socket on a burn-in board or similar apparatus used for testing conventional semiconductor packages. As shown in FIG. 6, the testing apparatus 40D includes electrical connectors 24D in electrical communication with testing circuitry 32D. The electrical connectors 24D comprise spring contacts that can be mechanically biased by a slide mechanism 64 into engagement with conductors 18D (FIG. 5) on the interconnect 10D. The conductors 18D are in electrical communication with contact members 14D (FIG. 5) and extend into the contact receiving cavities 16D (FIG. 5), substantially as previously described. A direct electrical connection is thus provided to the contact members 14D of the interconnect 10D rather than through the base 42. This direct electrical connection improves the testing procedure because the electrical path to the die 20D can be formed with low inductance, low resistance, reduced capacitance, and reduced parasitics. In addition, the electrical connection to the interconnect 10D is non-bonded so that replacement of the interconnect 10D is facilitated. For example, a second interconnect (not shown) for testing a different type of die can be substituted for the interconnect 10D.

Wafer Level System

Figures 7, 10A, 10B:
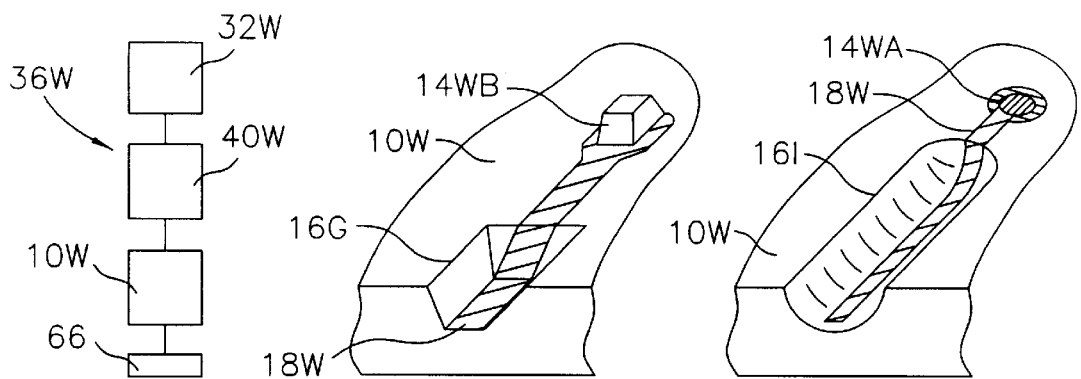
FIG. 7 is a block diagram of a wafer level test system constructed in accordance with the invention.
FIG. 10A is an enlarged schematic perspective view showing a contact receiving cavity on the wafer level test system formed using an anisotropic etch process.
FIG. 10B is an enlarged schematic perspective view of an alternate embodiment contact receiving cavity formed using an isotropic etch process.
Figure 8:
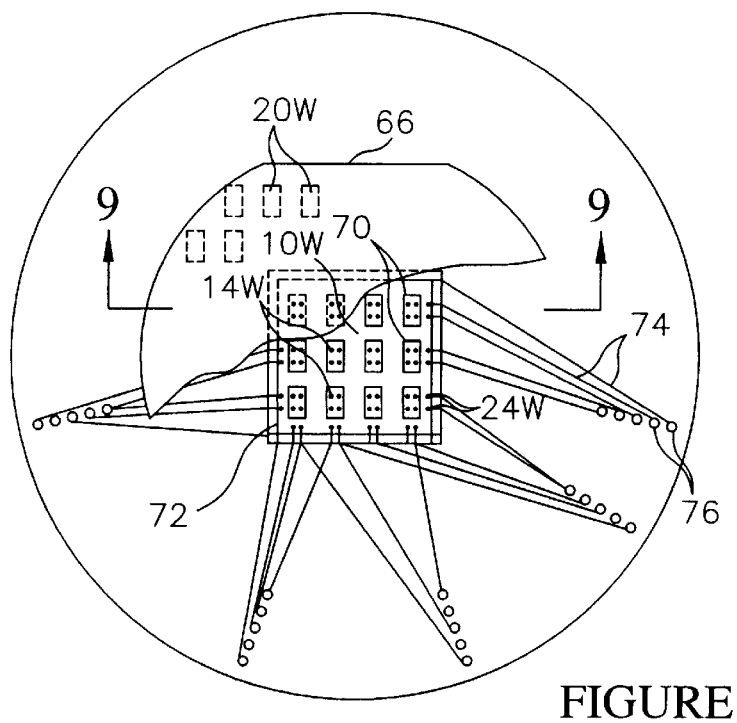
FIG. 8 is a schematic bottom view of an interconnect and probe card fixture for the wafer level test system.
Figure 9:
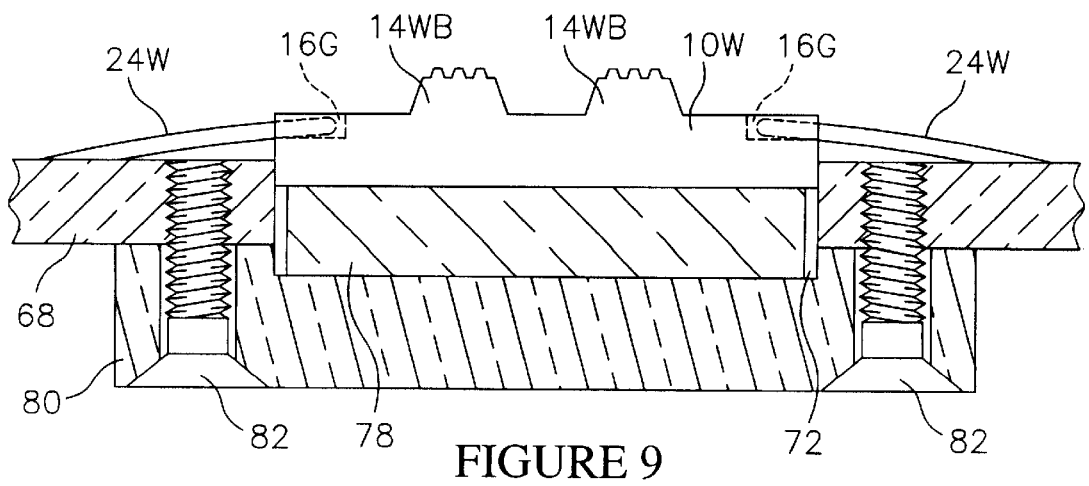
FIG. 9 is a schematic cross sectional view of the wafer level test system taken along section line 9—9 of FIG. 8.

Referring to FIGS. 7–9, a wafer level test system 36W is illustrated. The wafer level test system 36W (FIG. 7) is configured to test semiconductor dice 20W (FIG. 8) contained on a semiconductor wafer 66 (FIG. 8) or other semiconductor substrate. The wafer level test system 36W includes a testing apparatus 40W (FIG. 7) and a wafer interconnect 10W.

The testing apparatus 40W includes or is in electrical communication with testing circuitry 32W (FIG. 7). The testing apparatus 40W can be a conventional wafer probe handler, or probe tester, modified for use with the wafer interconnect 10W. In this system 36W, the interconnect 10W takes the place of a conventional probe card. Wafer probe handlers and associated test equipment are commercially available from Electroglass, Advantest, Teradyne, Megatest, Hewlett-Packard and others.

Referring to FIG. 8, the interconnect 10W includes contact members 14W configured to establish electrical communication with the dice 20W on the wafer 66. The contact members 14W on the interconnect 10W are formed in patterns 70 that match the patterns of the contact locations (e.g., 22B-FIG. 3B) on the dice 20W. In the illustrative embodiment there are twelve patterns 70 of contact members 14W arranged in three rows and four columns. This permits the interconnect 10W to contact and test twelve dice 20W on the wafer 66 at the same time. The testing apparatus 40W can be used to step the wafer 66, or to step the interconnect 10W, so that the remaining dice 20w can be tested in groups of twelve (or less) until all of the dice 20W on the wafer 66 have been tested.

Alternately, the interconnect 10W can be formed with enough patterns 70 of contact members 14W, to simultaneously contact every contact location for all of the dice 20W on the wafer 66. Test signals can then be selectively applied and electronically switched as required, to selected dice 20W on the wafer 66. In general, the interconnect 10W can be formed with any desired number of patterns 70 of contact members 14W. In addition, the interconnect 10W can be configured to test a complete semiconductor wafer 66 or to test a partial wafer or other substrate that has been segmented into arrays of dice.

As shown in FIGS. 8 and 9, the interconnect 10W mounts to a probe card fixture 68 of the testing apparatus 40W (FIG. 7). The probe card fixture 68 can be similar in construction to a conventional probe card fixture commercially available from manufacturers such as Packard Hughes Interconnect and Wentworth Laboratories. The probe card fixture 68 can be formed of an electrically insulating material such as FR-4 or ceramic.

The probe card fixture 68 includes an opening 72 for the interconnect 10W. In the illustrative embodiment both the interconnect 10W and the opening 72 have a generally rectangular peripheral configuration. In addition, the opening 72 is slightly larger in size than the interconnect 10W, so that a gap is present between the opening 72 and interconnect 10W.

The probe card fixture 68 also includes patterns of electrical connectors 24W that cantilever from the edges of the opening 72 into the opening 72. The electrical connectors 24W can be formed as spring contacts, spring loaded pins, or other electrical members, adapted to physically support, align and electrically connect to the interconnect 10W. As shown in FIG. 9, the electrical connectors 24W are configured for mating engagement with contact receiving cavities 16G formed in the interconnect 10W.

As shown in FIG. 10A, the contact receiving cavities 16G include conductors 18W, substantially equivalent to the conductors 18 (FIG. 1) previously described. The conductors 18W are in electrical communication with the contact members 14WB formed on the interconnect 10W. In FIG. 10A, the contact receiving cavities 16G comprise open ended slots or grooves with sloped sidewalls. The cavities 16G extend into an edge of the interconnect low generally perpendicular thereto. As will be further explained, the contact receiving cavities 16G can be formed in this configuration using an anisotropic etch process. Alternately as shown in FIG. 10B, contact receiving cavities 16I can be formed with a rounded contour as would occur with an isotropic etch process. As also shown in FIG. 10B, the conductors 18W can be formed in electrical communication with contact members 14WA for bumped dice, substantially as previously described for contact members 14A (FIG. 2A).

The contact receiving cavities 16G (FIG. 10A) or 16I (FIG. 10B) are formed with a size that corresponds to the size of the electrical connectors 24W (FIG. 9). In general, the contact receiving cavities 16G (FIG. 10A) or 16I (FIG. 10B), are slightly larger than the electrical connectors 24W. The dimensional tolerances of the contact receiving cavities 16G (FIG. 10A) or 16I (FIG. 10B), and the electrical connectors 24W, can be selected such that the mating engagement thereof, supports and positions, the interconnect 10W in a required location on the probe card fixture 68. Preferably, the contact receiving cavities 16G (FIG. 10A) or 16I (FIG. 10B) are closed on one end, and open along an edge of the wafer interconnect 10W. However, the contact receiving cavities can also be formed as open ended grooves as previously described.

As shown in FIG. 8, the electrical connectors 24W are in electrical communication with patterns of conductors 74 formed on the probe card fixture 68. The conductors 74 can be formed by thin film metallization on the probe card fixture 68, or can be part of a separate element such as TAB tape laminated to the probe card fixture 68. The conductors 74 terminate in plated through holes 76 in the probe card fixture 68. The holes 76 allow an electrical connection to be made with the testing circuitry 32W (FIG. 7). This electrical connection can be made using spring loaded pins, or other electrical connectors associated with the testing apparatus 40W, as is known in the art.

As shown in FIG. 9, a biasing member 78 can be mounted to a backside of the interconnect 10W. In addition, a retention member 80 can be attached to the probe card fixture 68 using threaded fasteners 82 or other fastening mechanism. The biasing member 78, and retention member 80, are configured to transfer forces exerted by the testing apparatus 40W (FIG. 7) to the interconnect 10W. These forces provides contact forces for forming the temporary electrical connections between the contact members 14WB on the interconnect 10W, and the contact locations 22B (FIG. 2B) on the wafer 66.

The biasing member 78 can be formed of a compressible material to provide a cushioning effect for the forces applied by the testing apparatus 40W (FIG. 7). Also, with this arrangement, the interconnect 10W is supported by the electrical connectors 24W but can move in the z-direction within a limited range. This allows the contact members 14WB (FIG. 10A) or 14WA (FIG. 10B) on the interconnect 10W, to self planarize to the z-direction location of the contact locations 22B (FIG. 2B) or 22A (FIG. 2A) on the wafer 66.

By way of example, the biasing member 78 can be formed of an elastomeric material such as silicone, butyl rubber, or fluorosilicone; in foam, gel, solid or molded configurations. Suitable elastomeric materials include "PORON" available from Rogers or "BISCO" available from a Dow Chemical subsidiary. The biasing member 78 can have a peripheral outline that corresponds to a peripheral outline of the interconnect 10W. A representative thickness for the biasing member 78 can be from 0.5 mm to 4 mm. If desired, the biasing member 78 can be secured to the interconnect 10W or retention mechanism 80 using an adhesive such as silicone. One suitable adhesive is "ZYMET" silicone elastomer manufactured by Zymet, Inc., East Hanover, N.J.

Alternately, the biasing member 78 can be formed of a heat conductive material, such as a metal filled elastomer, configured to conduct heat from the wafer 66. As another alternative, the biasing member 78 can be formed as a compressible gas filled bladder. This type of bladder is available from Paratech of Frankfort, Ill. under the trademark "MAXI FORCE AIR BAG".

Testing Method

Referring again to FIGS. 4–6, a representative test sequence for the die level system 36D is as follows. Initially the temporary package 38 and testing apparatus 40D (FIG. 6) can be provided. In addition, the interconnect 10D can be mounted to the package base 42 as previously described. For assembling the package 38 with the die 20D therein, the contact locations 22A (FIG. 3A) on the die 20D can be aligned with the contact members 14D on the interconnect 10D. This can be accomplished using an optical alignment apparatus as described in the previously cited U.S. Pat. No. 5,519,332. The aligned die 20D and interconnect 10D can then be placed in contact and the force applying mechanism 44 attached to the base 42.

The assembled temporary package 38 can then be placed within the testing apparatus 40D. Mounted within the testing apparatus 40D, the electrical connectors 24D (FIG. 6) on the testing apparatus 40D engage the contact receiving cavities 16D on the interconnect 10D to establish a direct electrical connection to the contact members 14D. Test signals can then be applied by the testing circuitry 32D (FIG. 6) to the integrated circuits contained on the die 20D.

Referring again to FIGS. 7–9, a representative test sequence for the wafer level system 36W is as follows. Initially the testing apparatus 40W (FIG. 7) can be provided. The interconnect 10W can be mounted to the testing apparatus 40W with the electrical connectors 24W physically supporting the interconnect 10W. In addition, the electrical connectors 24W provide a direct electrical connection to the contact members 14W (FIG. 8).

The testing apparatus 40W can then be operated to bias the interconnect 10W and wafer 66 (FIG. 8) together. The biasing member 78 functions as previously described to cushion the forces applied by the testing apparatus 40W to the interconnect 10W and to allow the contact members 14W to self planarize to the contact locations on the wafer 66. Test signals can then be applied by the testing circuitry 32W (FIG. 7) to the integrated circuits on the dice 20W.

If the interconnect 10W is configured to contact all of the dice 20W on the wafer 66 at the same time, the test signals can be electronically switched, as required, to selected dice 20W. If the interconnect 10W is configured to contact a portion of the dice 20W on the wafer, stepping techniques can be used to step the interconnect 10W, or the wafer 66, such that the dice 20W are tested in sequence. In addition, the mounting of the interconnect 10W to the probe card fixture 68, permits different interconnects to be easily interchanged for testing different types of wafers.

Method of Fabrication

Figure 11A:
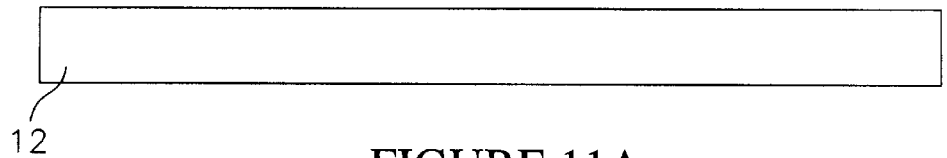
FIGS. 11A—11C are schematic cross sectional views illustrating a fabrication process for the interconnect for dice with bumped contact locations.
Figure 11B:
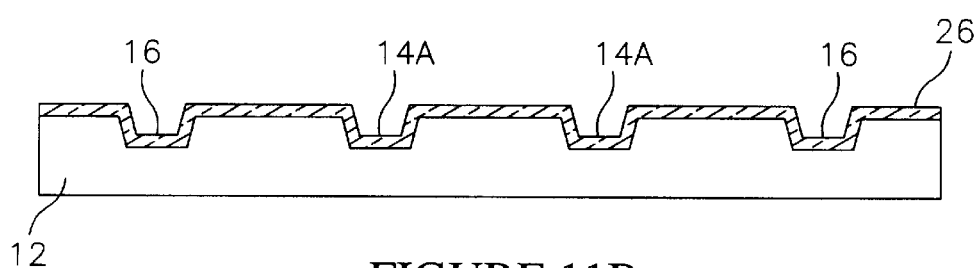
Figure 11C:
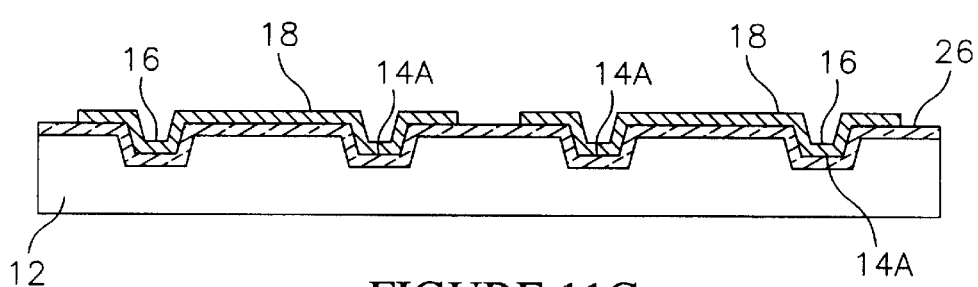

Referring to FIGS. 11A–11C, a fabrication method for forming the interconnect with contact members 14A for bumped dice is illustrated. Initially, as shown in FIG. 11A the substrate 12 is provided. In the process illustrated in FIGS. 11A–11C, the substrate 12 comprises silicon or other etchable semiconductor material. The substrate 12 can comprise a wafer of material similar in size to a conventional semiconductor wafer. For forming a die level interconnect the substrate 12 can subsequently be singulated into die sized segments, such as by saw cutting. For forming a wafer level interconnect, the entire substrate 12, or portions of the substrate 12, can be used.

Next, as shown in FIG. 11B, the substrate 12 can be etched with indentations for the contact members 14A, and grooves for the contact receiving cavities 16. The same etch mask can be used for etching both the indentations and grooves. For example, a mask (not shown) can be formed on the substrate 12 by depositing a layer of silicon nitride ($Si_3N_4$) and then patterning the silicon nitride layer using hot phosphoric acid. A wet or dry, isotropic or anisotropic, etch process can then be used to etch through openings in the mask. For example, an anisotropic etch can be performed on a silicon substrate 12 using a solution of KOH and $H_2O$. This type of etching process is sometimes referred to as "bulk micromachining". The depth of the etch can be controlled using techniques that are known in the art.

Following the etch process the insulating layer 26 can be formed. The insulating layer 26 can be a grown or deposited material such as $SiO_2$ or $Si_3N_4$. A representative thickness for the insulating layer 26 can be from 500 Å to 1 $\mu$m.

Next as shown in FIG. 1C, the conductors 18 can be formed. The conductors 18 can be formed on the substrate 12 using a metallization process (e.g., blanket depositing metal, depositing resist, exposing, developing, etching). For example, a highly conductive metal can be blanket deposited on the substrate 12 by sputtering or other deposition process and then patterned as required. Exemplary metals include aluminum, platinum, palladium, copper, gold and silver or alloys of these metals. A representative thickness for the conductors 18 can be from 500 Å to 2 $\mu$m. The completed interconnect includes contact members 14A and conductors 18 in required patterns. In addition, the conductors 18 extend into the contact receiving cavities 16.

Figure 12A:
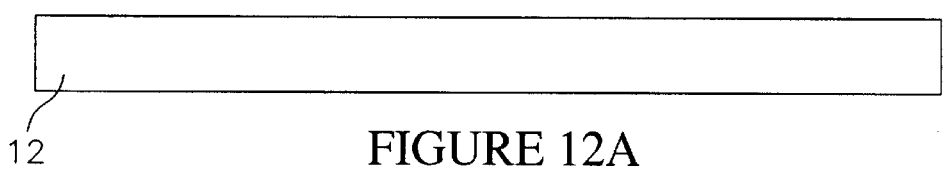
FIGS. 12A–12C are schematic cross sectional views illustrating a fabrication process for the interconnect for dice having flat contact locations.
Figure 12B:
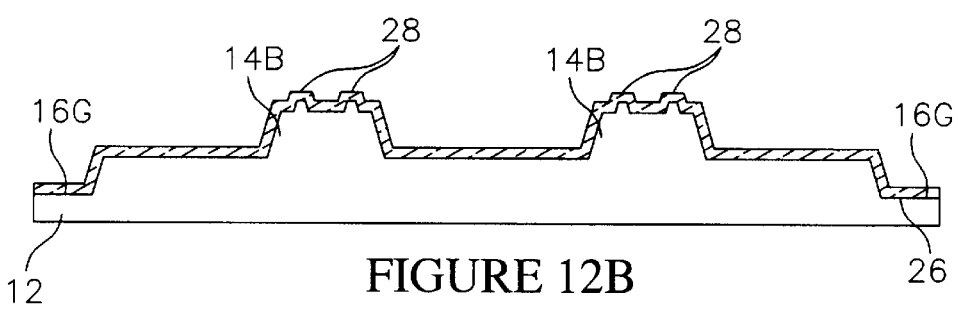
Figure 12C:
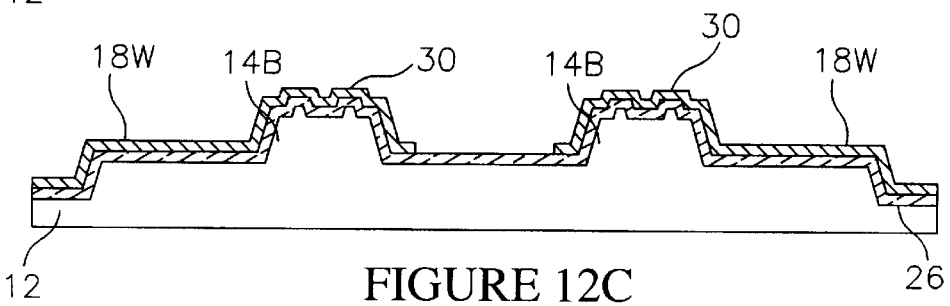

Referring to FIGS. 12A–12C, a process for forming the interconnect with contact members 14B is shown. Initially, as shown in FIG. 12A, the substrate 12 is provided substantially as previously described. Next, as shown in FIG. 12B, the penetrating projections 28 can be formed using an etch process, substantially as previously described. In addition, the contact members 14B can be etched in the substrate using a subsequent etch process. The contact receiving cavities 16G can then be formed using yet another etch process. Next, as shown in FIG. 12C, the insulating layer 26 can be formed substantially as previously described. In addition, conductive layers 30 can be formed on the contact members 14B. The conductors 18W can then be formed on the substrate 12 in electrical communication with the conductive layers 30.

Thus the invention provides an improved interconnect, test method and system for testing semiconductor dice and wafers. The interconnect can include contact members formed on a silicon or ceramic substrate such that a CTE with the dice or wafer is matched. In addition, contact members can be formed on the interconnect in dense arrays to accommodate testing of dense arrays of dice having dense contact locations. Still further, the interconnect can be made to form a direct, non-bonded electrical connection to permit easy replacement of the interconnect. This non-bonded electrical connection can be made using spring clips, "POGO PINS" or similar member that are known in the art While the invention has been described with reference to certain preferred embodiments, as will be apparent to those skilled in the art, certain changes and modifications can be made without departing from the scope of the invention as defined by the following claims.

What is claimed is:

1. A system for testing a semiconductor die having a contact location comprising:

a substrate comprising a surface, a cavity on the surface, a contact member on the surface configured to electrically engage the contact location on the die and a conductor on the surface extending into the cavity in electrical communication with the contact member; and a testing apparatus comprising an electrical connector retained in the cavity in electrical communication with the conductor to provide a direct electrical path to the contact member.

2. The system of claim 1 wherein the testing apparatus comprises a wafer handler.

3. The system as claimed in claim 1 wherein the testing apparatus comprises test circuitry in electrical communication with the electrical connector.

4. The system as claimed in claim 1 wherein the testing apparatus comprises a probe card fixture for supporting the electrical connector.

5. The system of claim 1 wherein the testing apparatus comprises a wafer handler and the electrical connector comprises a spring loaded pin.

6. A system for testing a semiconductor die having a contact location comprising:

a temporary package for housing the die;

an interconnect on the package comprising a substrate, a contact member on the substrate configured to electrically contact the contact location on the die, a cavity in the substrate, and a conductor on the substrate in electrical communication with the contact member having a portion extending into the cavity; and a testing apparatus comprising an electrical connector in electrical communication with testing circuitry, the connector retained in the cavity in electrical communication with the conductor, to provide a direct electrical path through the conductor to the contact member.

7. The system of claim 6 wherein the contact member comprises a depression in the interconnect at least partially covered by the conductor.

8. The system of claim 6 wherein the contact member comprises a projection configured to penetrate the contact location.

9. The system of claim 6 wherein the electrical member comprises a spring clip.

10. The system of claim 6 wherein the cavity comprises an elongated structure.

11. A method for testing a semiconductor die having a contact location comprising:

providing an interconnect comprising a substrate, a contact member on the substrate configured to electrically engage the contact location, a cavity in the substrate, and a conductor on the substrate in electrical communication with the contact member having a portion extending into the cavity, the cavity and the portion configured to retain and electrically engage an electrical connector of a testing apparatus to provide a direct electrical path to the contact member;

retaining the electrical connector within the cavity in electrical communication with the conductor and the contact member; and applying test signals through the electrical connector to the die.

12. The method of claim 11 wherein the die comprises a singulated die.

13. The method of claim 11 wherein the die is contained on a semiconductor wafer.

14. A method for testing a semiconductor wafer having a die with a contact location comprising:

providing a testing apparatus comprising an electrical connector in electrical communication with testing circuitry;

providing an interconnect comprising a substrate, a contact member on the substrate for electrically engaging the contact location, a cavity in the substrate a conductor on the substrate in electrical communication with the contact member having a portion in the cavity, the cavity configured to retain the connector in electrical communication with the conductor;

placing the connector in the cavity in electrical communication with the conductor to provide a direct electrical path through the conductor to the contact member;

placing the contact member in electrical communication with the contact location; and applying test signals from the testing circuitry through the connector and the contact member to the die.

15. The method of claim 14 wherein the interconnect is configured to test a plurality of dice on the wafer at a same time.

16. The method of claim 14 further comprising providing the interconnect with a plurality of contact members in electrical communication with a plurality of dice on the wafer and electronically switching the test signals between the dice.

17. The method of claim 14 wherein the testing apparatus comprises a plurality of connectors configured to mount the interconnect to the testing apparatus.

18. The method of claim 14 wherein the testing apparatus comprises a wafer probe handler.

19. The method of claim 14 wherein the testing apparatus comprises a probe card fixture having a plurality of electrical connectors configured to engage a plurality of cavities on the interconnect.

20. A system for testing a semiconductor wafer having a plurality of contact locations comprising:

an interconnect comprising a substrate, a plurality of cavities in the substrate, a plurality of contact members on the substrate configured to electrically engage the contact locations on the wafer, and a plurality of conductors on the substrate in electrical communication with the contact members having portions extending into the cavities; and a testing apparatus comprising a plurality of electrical connectors in electrical communication with testing circuitry configured to apply test signals to the wafer, the connectors retained in the cavities in electrical communication with the conductors to provide a direct electrical path through the conductors to the contact members.

21. The system of claim 20 wherein the wafer comprises a plurality of dice and the contact members are configured to electrically connect to the dice at a same time.

22. The system of claim 20 wherein the contact members are configured to electrically engage planar contact locations or bumped contact locations.

23. A system for testing a semiconductor die contained on a wafer comprising:

a testing apparatus comprising an electrical connector in electrical communication with testing circuitry configured to apply test signals to the die; and an interconnect comprising a substrate, a contact member on the substrate configured to electrically connect to a contact location on the wafer, a conductor on the substrate in electrical communication with the contact member, and a cavity in the substrate at least partially covered with a portion of the conductor, the cavity configured to retain the electrical connector in contact with the conductor to provide a direct electrical path through the conductor to the contact member.

24. The system of claim 23 wherein the interconnect comprises a plurality of cavities in the substrate configured to engage a plurality of connectors for physically mounting the interconnect to the testing apparatus.

25. The system of claim 23 wherein the wafer comprises a plurality of semiconductor dice.

26. The system of claim 23 wherein the wafer comprises a plurality of semiconductor dice and the interconnect is configured to electrically engage all of the dice at a same time.

27. The system of claim 23 wherein the testing apparatus comprises a wafer probe handler.

28. The system of claim 23 wherein the contact member comprises a projection configured to penetrate the contact location on the die.

29. The system of claim 23 wherein the contact member comprises a depression configured to retain the contact location.

30. A system for testing a semiconductor die contained on a wafer comprising:

a wafer testing apparatus comprising a probe card fixture comprising an opening and a plurality of electrical connectors proximate to the opening in electrical communication with testing circuitry; and an interconnect placed through the opening and supported by the electrical connectors, the interconnect comprising a substrate having a surface, a plurality of contact members on the surface for electrically contacting the die, a plurality of conductors on the surface in electrical communication with the contact members, and a plurality of cavities in the surface configured to retain the connectors in electrical communication with the conductors.

31. The system of claim 30 wherein the cavities comprise a plurality of grooves along an edge of the substrate.

32. The system of claim 31 wherein the interconnect further comprises a compressible member in contact with the substrate for cushioning forces applied by the testing apparatus to the interconnect.

33. The system of claim 32 wherein the compressible member comprises an elastomer or a metal filled elastomer.

34. The system of claim 32 wherein the compressible member comprises a gas filled bladder.

35. The system of claim 32 wherein the interconnect further comprises a retention member attached to the probe card fixture in contact with the biasing member.

36. The method of claim 14 wherein the electrical connector comprises a spring loaded pin.

* * * * *